United States Patent [19]
Schmidt et al.

[11] Patent Number: 5,639,389
[45] Date of Patent: Jun. 17, 1997

[54] PROCESS FOR THE PRODUCTION OF STRUCTURES

[75] Inventors: Walter Schmidt, Zürich; Marco Martinelli, Neftenbach, both of Switzerland

[73] Assignee: Dyconex Patente AG, Zug, Switzerland

[21] Appl. No.: 389,299

[22] Filed: Feb. 16, 1995

[30]  Foreign Application Priority Data

Feb. 21, 1994 [CH] Switzerland ............... 00505/94

[51] Int. Cl.$^6$ ............... H05K 3/06; H05K 3/07
[52] U.S. Cl. ............... 216/18; 216/20; 216/39; 216/100
[58] Field of Search ............... 216/18, 20, 39, 216/100

[56]  References Cited

U.S. PATENT DOCUMENTS

| | | | |
|---|---|---|---|
| 3,276,106 | 10/1966 | Bester et al. | 216/18 |
| 3,471,631 | 10/1969 | Quintana | 174/68.5 |
| 4,118,523 | 10/1978 | Bingham et al. | 427/97 |
| 4,174,261 | 11/1979 | Pellegrino | 204/273 |
| 4,472,238 | 9/1984 | Johnson | 156/643 |
| 4,517,050 | 5/1985 | Johnson et al. | 216/18 |
| 4,536,249 | 8/1985 | Rhodes | 216/18 |
| 4,720,322 | 1/1988 | Tiffin | 156/643 |
| 5,352,325 | 10/1994 | Kato | 216/18 |
| 5,378,314 | 1/1995 | Schmidt et al. | 156/644 |

FOREIGN PATENT DOCUMENTS

| | | | |
|---|---|---|---|
| 0 575 292 | 12/1993 | European Pat. Off. | |
| 62-221119 | 9/1987 | Japan | 216/18 |
| 1-270398 | 10/1989 | Japan | 216/20 |
| WO93/26143 | 12/1993 | WIPO | |

Primary Examiner—Glenn A. Caldarola
Assistant Examiner—J. Pasterczyk
Attorney, Agent, or Firm—Walter C. Farley

[57]  ABSTRACT

A process for the production of printed circuit boards and film circuit boards includes providing a starting product with a layer of insulating material between layers of metal. Openings are formed at desired locations through the metal and, at selected ones of those openings, openings are formed through the insulating material by plasma etching or chemical etching. The result of this is back-etching leaving projecting webs of metal extending partly across the openings. The projecting edges are removed by subjecting all of the metal surfaces to etching or electrodeplating which also thins the metal layers. The resulting structure is then plated, adding reinforcing thickness to the thinned metal layers and coating the openings through the insulating material with metal, providing interracial connections between the metal layers. The resulting intermediate can then be formed into a circuit board by forming circuit patterns in the metal layers.

10 Claims, 2 Drawing Sheets

PROCESS FOR THE PRODUCTION OF STRUCTURES

FIELD OF THE INVENTION

This invention is in the field of the production of printed circuit boards and film circuit boards and relates to a process for the production of structures, patterns or shapes in plasma-etchable insulating material which is clad with plasma etching-resistant conductor material.

BACKGROUND OF THE INVENTION

Plasma-etchable insulating material can be structured in a plasma etching process known as the DYCOstrate® process. Such structures can be openings which pass through the insulating material as through holes, or can be blind holes which merely extend into the insulating material. Through holes and blind holes can also be in the form of elongated holes resembling grooves which extend in different and varying depths in the insulating material with straight or curved edges. During plasma etching, the structures are simultaneously produced with high precision in the insulating material. This process is economical because it permits inexpensive, rapid formation of very varied structures and patterns in the insulating material. The plasma-etchable insulating material is constituted by organic, dielectric films such as, for example, polyimides or cyanateester resin films, as well as films of liquid crystal polymers (LCP), etc.

In order to be able to etch such insulating material with a locally controlled plasma, the material is coated with a plasma etching-resistant material. Such plasma etching-resistant materials can be metal layers of copper of aluminum, i.e., layers made of plasma etching-resistant electrically conductive material. The applied, plasma etching-resistant material is provided with openings extending therethrough to the insulating material, exposing the insulating material so that the plasma can interact through the openings with the insulating material and etch it.

Since, for thermal reasons and for reasons of the plasma etching rate associated therewith, directional plasma etching (reactive ion etching) does not appear appropriate for the production of film circuit boards, use is made of isotropic plasma etching, i.e., insulating material is uniformly removed everywhere the plasma has access to it. Thus, the insulating material can also be removed under the edges of the openings in the plasma etching-resistant material, i.e., below the plasma etching-resistant material. This under-etching or under-cutting means that the edges of the openings project in quasi-insulated manner in the space from the solid or rigid plasma etching-resistant material following plasma etching and that the insulating material has etched-back cavities.

The use of plasma etching-resistant conductive material firmly attached to the plasma-etchable insulating material has proved advantageous in the manufacture of printed circuit boards and film circuit boards. Such conductor material can be applied to one or both sides of the insulating material in the form of clad copper layers. Following the plasma etching of openings in the insulating material, the conductor material can be structured or patterned to form electrical current paths in subsequent processing stages and the openings in the insulating material can be plated with metal to form interfacial connections between different planes of structured material.

However, etch-backs, i.e., the projecting edges or webs of plasma etching-resistant material around openings in the insulating material prove disadvantageous for the additional subsequent processing stages. Thus, the following problems occur in the electro-deposition of copper:

The regions under the projecting webs around openings in the insulating material is electrically shielded during the electro-deposition of metal layers, so that only small quantities of copper are deposited. The result is, for example, that the reliability of interfacial connections is not ensured.

The etched-back cavities of the openings in the insulating material cannot be adequately cleaned by techniques such as degassing or washing out. In electro-deposition with a plurality of successive baths, this leads to inadequate results and to carrying-over of chemicals from one bath to the next.

The webs around the openings in the insulating material are thin and easy to deform mechanically. For example, they are bent up and deformed by ultrasonic baths when such baths are used as the cleaning medium. This leads to undesirable results during subsequent photochemical process stages.

One possibility for removing the projections at etch-backs is to press the webs around the plasma-etched openings by pressure action into the openings in the insulating material such as described, for example in U.S. Pat. No. 4,472,238. This patent uses two-sided, copper-clad polyimide films such as Pyralux® DuPont F9111, or copper foil-coated Kevlar® as the plasma etching-resistant material and plasma-etchable insulating material. Copper edges projecting over the 76–254 µm diameter holes in the nonconductive polyimide or Kevlar films are pressed into the holes at 124 atm.

This process suffers from serious disadvantages. The finer the plasma-etched structures which are under-etched, the greater the overpressures which must be applied in order to press the webs into the openings. This leads to excessive mechanical stressing and undesirable dimensional changes and is consequently technically impractical.

Another possibility for removing the under-etchings is to press the webs around plasma-etched openings into the openings by material bombardment. In printed circuit board technology, such a process is referred to as a jet scrubber process in which, typically, an aqueous solution of pumice powder is sprayed under high pressure against the projecting edges of openings so that the webs are pressed into the openings.

However, this process also suffers from serious disadvantages. There is a mechanical cold deformation of the pumice powder-bombarded surfaces which leads to undesired mechanical stresses and dimensional changes. The process is only usable with very thin layers of plasma etching-resistant conductor material. Also, there is a partial incorporation of the pumice powder and knocked-off particles of plasma etching-resistant material into other areas of the printed circuit board or film circuit board to be produced which, in turn, leads to disturbing effects such as impurities, electrical short-circuit contacts and the like. Thus, this process is technically impractical.

SUMMARY OF THE INVENTION

An object of the invention is to obviate these problems. The invention permits production of structures in insulating materials, etchable in a first etching process, which is clad with conductive material, resistant to the first etching process. In particular, operationally reliable production of structures in plasma etching-resistant conductive material is made possible. Furthermore, such production requires a relatively small number of working steps using established, proven processing steps.

The concept of the invention was arrived at in the light of the disadvantageous effects of under-etching and in an attempt to prevent that effect. Such under-etching is generally undesired and is prejudicial to product quality. In accordance with the present invention, such under-etching is brought about in a planned manner in order to produce structures, patterns or shapes in an insulating material and are removed again in an equally planned manner in order to produce structures in a conductor material. According to the invention, disadvantageous weak points of structures in one material produced by a first process are used as advantageous weak points in the production of structures in the other material by a second process, so that the weak points are removed and the product quality is optimized.

According to the invention, two different etching processes are successively used. First, there is an etching process for etching the insulating material while the conductive material remains unaffected. This is followed by a structuring process for structuring the conductive material while the insulating material is not attacked. Both processes, namely etching of insulator material and structuring of conductor material, are isotropic processes. The action of the processes is balanced out. All etch-backs disadvantageous for further processing stages produced by the etching process of insulator material are preferably removed in the structuring process of the conductive material.

BRIEF DESCRIPTION OF THE DRAWINGS

The process of the invention will be described with reference to the following drawings wherein.

DESCRIPTION OF THE PREFERRED EMBODIMENTS

The invention involves a process for the production of printed circuit boards and film circuit boards from starting materials and via intermediates. The starting materials comprise plasma-etchable insulating material coated on one or both sides with plasma etching-resistant conductive material. In a first process stage, openings are plasma-etched in the insulating material in accordance with openings prepared in the conductive material, the edges of the prepared openings being plasma-back-etched. The prepared openings in the conductor material and the openings in the insulating material are etched back in a planned manner. In a second process stage, the projecting edges are chemically etched away. The prepared openings in the conductive material and the openings in the insulating material are consequently structured in a planned manner in back-etch-free manner. Thus, intermediates are formed which can be further processed, e.g., by plating, to form printed circuit boards and film circuit boards.

Figure 1:
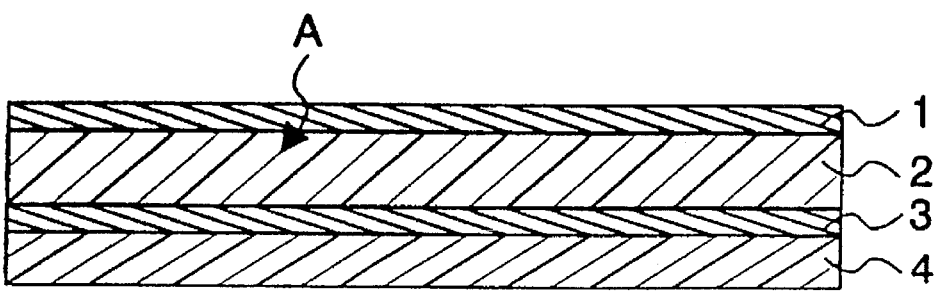
FIG. 1 is a schematic sectional view of a starting product for producing printed circuit boards and film circuit boards.

In FIG. 1, a starting material A for the production of printed circuit boards and film circuit boards is a multilayer structure comprising a layer of plasma-etchable insulating material 2 coated on both sides with a plasma etching-resistant conductive material 1, 3. The plasma-etchable insulating material 2 is made of an organic dielectric film such as polyimide film, aramide fiber-reinforced laminates of epoxy, polyimide or cyanate-ester resin film or films of liquid crustal polymers (LCP). The layers of plasma etching-resistant conductive material 1, 3 are metal layers such as copper, aluminum or silver. The conductive material layers 1, 3 are laminated onto the insulating material 2 or are applied thereto galvanically or by vapor deposition, sputtering or plasma-activated vapor phase deposition (PECVD) and mechanically firmly attached thereto. The starting product A is laminated onto a carrier substrate 4 and firmly mechanically attached thereto.

In advantageous embodiments of starting products A for the production of film circuit boards, the layers of insulating material 2 and conductive material 1, 3 are formed from specific desirable materials and are particularly thin. Thus, starting product A preferably comprises a polymer film, copper-clad on both sides, in which the polymer film is 25 to 50 µm thick and each of the copper layers is 8 to 12 µm thick. Naturally, a starting product A for the production of printed circuit boards can be formed from much thicker layers of insulating material and conductive material and may have only one layer of conductive material 1 on insulating material 2.

Figure 2:
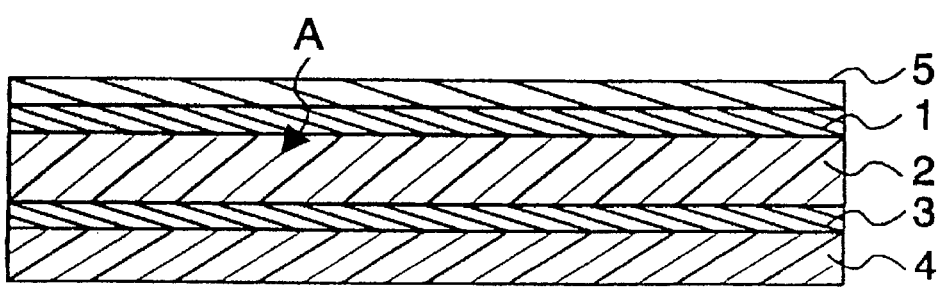
FIG. 2 is a schematic sectional view of the material of FIG. 1 with the addition of a photoresist layer.

FIG. 2 shows a starting product A as in FIG. 1 but with the addition of a photoresist layer 5 on conductive layer 1 such that the conductive layer is completely covered with the photoresist. It is possible to use either a solid or a liquid photoresist. The photoresist can be exposed by a known photochemical process. An opening design is transferred using photomasks onto photoresist 5. The opening design includes the position and structure of the openings or structures to be produced in insulating material 2.

Figure 3:
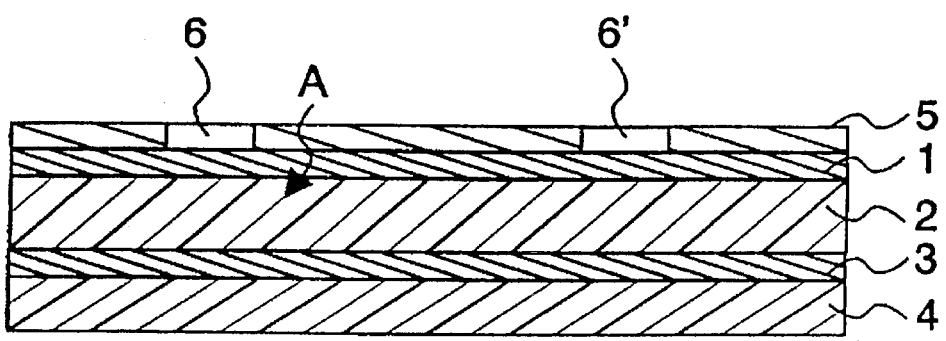
FIG. 3 is a schematic sectional view of the product of FIG. 2 with openings formed in the photoresist layer.

FIG. 3 shows the photochemically performed structuring of the photoresist layer 5 complying with the opening design. In the structured photoresist layer 5 are formed opening structures 6 and 6' which extend through to conductive material layer 1. The other areas of conductive material layer 1 covered with the photoresist are protected against wet chemical etching in the subsequent photochemical processing stages. The area of the opening structures is 10 to 100 µm. The shapes of the surfaces are freely selectable and can be circular, oval, square rectangular or other polygonal.

Figure 4:
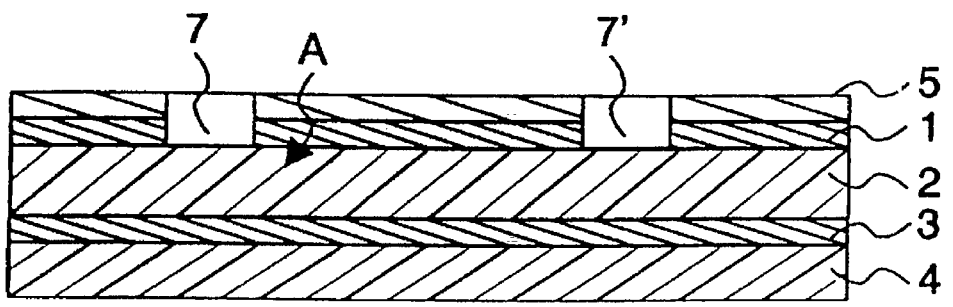
FIG. 4 is a schematic sectional view of the product of FIG. 3 after wet chemical etching.

In FIG. 4, the conductive material layer 1 is covered with a photochemically structured photoresist layer 5 following the wet chemical etching of the portions of conductive material 1 not covered by photoresist 5. According to the design of the openings, this etching only takes place in the vicinity of opening structures 6, 6' and leads to the planned formation of prepared openings 7, 7' in conductive material 1, the openings extending down to insulating material 2. Such masks are not attacked by the etching medium and the medium can only pass to conductive material 1 to be etched in the vicinity of openings in said masks.

Figure 5:
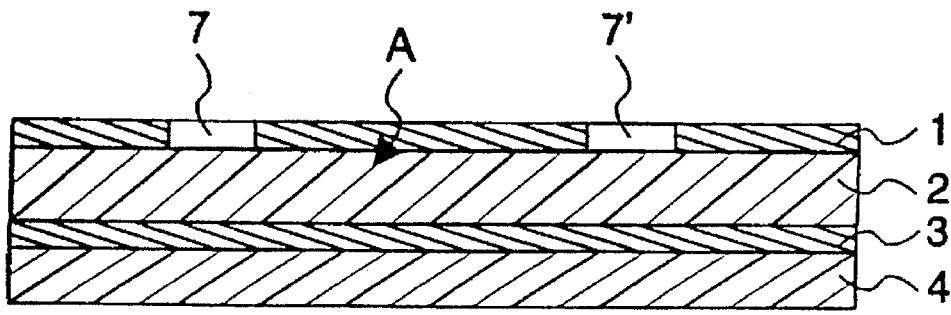
FIG. 5 is a schematic sectional view of the product of FIG. 4 after removal of the photoresist layer.

FIG. 5 shows the starting product A at the production stage shown in FIG. 4 but after the additional step of removing photoresist 5 which is done using known, proven chemical processes. This step is optional because, as a function of the nature and duration of the following plasma etching of insulating material 2, photoresist 5 is more or less completely removed.

Figure 6:
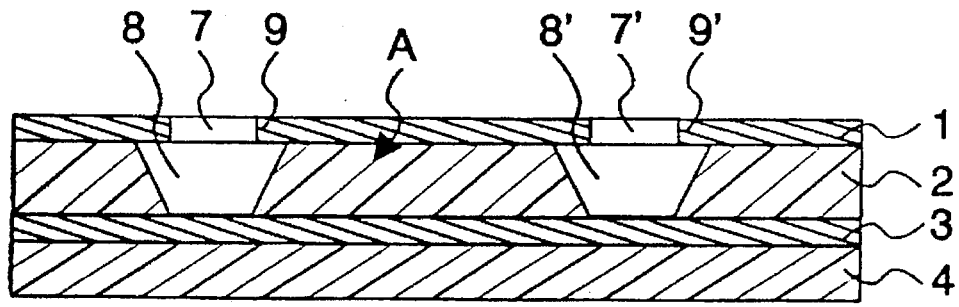
FIG. 6 is a schematic sectional view of the product of FIG. 5 following plasma etching.

FIG. 6 shows material A without the photoresist layer and following plasma etching of openings or structures 8, 8' through insulating material 2 and extending down to conductive material layer 3. In this process step, plasma-etchable insulating material 2 is isotropically plasma-etched in accordance with the prepared openings 6, 6' of the clad layer of plasma etching-resistant conductive material 1. Wherever the plasma comes into contact with insulating material 2, openings are formed, conductive material 1 is back-etched and has at these openings projecting edges or webs 9, 9'. These projecting edges 9, 9' border structures 8, 8' in the insulating material and are quasi-insulated in the space.

Figure 7:
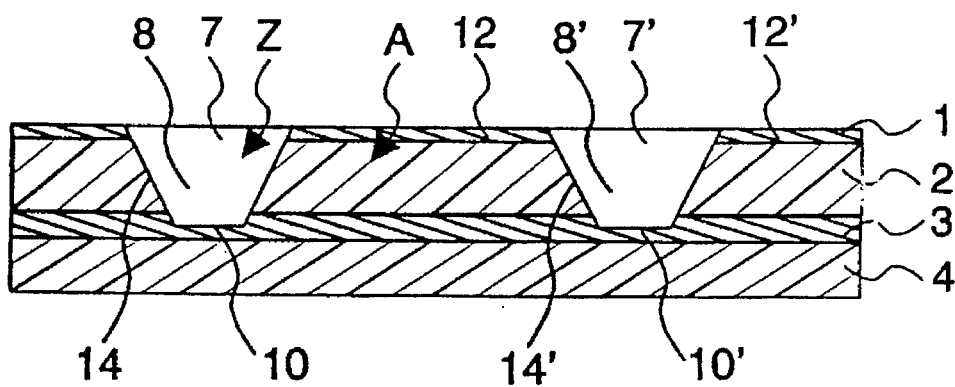
FIG. 7 is a schematic sectional view of the product of FIG. 6 after a second etching step.

FIG. 7 shows product A with etched-back openings or structures 8.8' in insulating material 2 resulting from the through-etching of webs 9, 9' of upper, structured conductive material layer 1. In the second production stage, the plasma etching-resistant conductive material 1, 3 is isotropically chemically etched, i.e., it is etched away wherever etching chemicals come into contact with conductive material 1, 3.

Chemical etching takes place uniformly in all surface areas accessible to the chemicals. The edges 9, 9' of plasma etching-resistant conductive material layer 1 projecting in quasi-insulated manner in the space have a large surface-to-volume ratio and are particularly readily accessible to chemicals and are chemically etched away, whereas the other surfaces 12, 12' of conductive material layer 1, 3 which are not back-etched are only chemically thinned. Thus, the exposed surface areas of lower conductive material layer 3, forming the bottoms 10, 10' of openings 8, 8' in insulating material 2 are uniformly etched thinner but instead of being etched away they merely undergo a thickness reduction.

The chemical etching parameters are chosen in such a way that conductive material 1, 3 is etched away, that conductive material 1, 3 fulfills a mechanically stabilizing and electrical conducting function for starting product A and that projecting edges 9, 9' of the conductive material are etched away or through. The etch-backs from the first process stage are consequently removed in a planned manner so that an intermediate Z is produced. Openings 8, 8' shown in FIG. 7 can, e.g., be in the form of blind holes or grooves. When using approximately 10 μm thick conductive material layers 1, 3 made from copper, projecting edges 9, 9' are simultaneously etched from all sides thereof and are consequently completely etched away when on the other, covered and consequently not back-etched surface areas, only about 5 μm of the conductive material is etched away. Thus, there remain varyingly thick areas of conductive material 1, 3. It is easy for the expert with knowledge of the present invention to choose the chemical etching parameters for the particular materials used and for their material thicknesses so that the second process stage is terminated when the disadvantageous projecting edges around plasma-etched openings of the conductive material have been etched away or through. Such chemical etching processes are proven, known procedures in the circuit board industry. For example, copper layers 1, 3 can be etched by sodium persulphate, copper chloride and hydrogen peroxide. The removal rate is very precisely controlled by the exposure time and the temperature of the etching medium.

Figure 8:
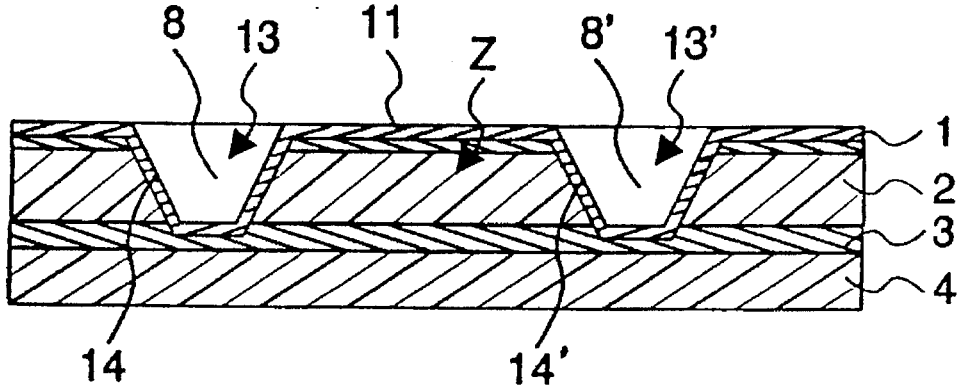
FIG. 8 is a schematic sectional view of the product of FIG. 7 after plating.

FIG. 8 shows the intermediate Z according to FIG. 7 but following plating onto the conductive layers 1, 3 a layer of plasma etching-resistant, electrically conductive material 11. This process stage is optional and serves either to mechanically reinforce or electrically connect the layers of chemically thinned conductive material 1, 3, or both. For example, thin metal layers of copper or palladium can be plated on as plasma etching-resistant, electrically conductive material 11.

Intermediate Z is suitable for the production of printed circuit boards and film boards. With the thus reinforced conductive material layers 1, 3, 11, the product can undergo structuring of current paths and interfacial connections using, for example, the DYCOstrate® process. Such structures can be current paths in conductive material layers, but can also be interfacial connections in openings of insulating material layers so that different layers of structured conductive material can be electrically interconnected. Numerous implementation possibilities are available to the expert with this knowledge of the present invention.

Openings 8, 8' shown in FIG. 8 are blind holes with walls 14, 14' sloping relative to the flat extension of intermediate Z which, after plating, electrically interconnect conductive material layers 1, 3 as interfacial connections 13, 13'. Such sloping walls 14, 14' can be better photochemically structured in further production stages. Such sloping walls 14, 14' can also be more easily cleaned. In addition, such sloping walls are more reliable against disturbing external influences. If insulating material layer 2 is extended in the Z direction, due, for example, to a temperature rise during soldering, sloping walls do not fracture as easily at the corners and edges as vertical walls.

During photochemical structuring, sloping walls 14, 14' are better accessible through prepared openings 7, 7' in conductive material 1 plated with electrically conductive material 11. It is also possible to use negative operating photoresists which can be exposed in the interfacial connections 13, 13' and which are cheaper and less sensitive as compared to positive operating photoresists. The higher sensitivity has the important advantage that lower exposure sensitivities are required and faster exposure can take place.

The formation of openings 7, 7' in the conductive material layer 1 according to FIGS. 1 to 5 can simultaneously and in completely identical manner be performed in the second conductive material layer 3. For this purpose, the intermediate Z is not laminated onto carrier substrate 4 at least in the surface areas intended for this, so that at these points the conductive material layer 3 can be coated with photoresist. This photoresist layer is then structured with openings and, in the chemical etching process, prepared openings are etched in the conductive material layer in accordance with these opening structures. In the plasma etching process, openings or structures are plasma etched in the insulating material corresponding to these prepared openings in the conductive material layer. Such structures can then have perpendicular or sloping walls relative to the plane containing the major surface of intermediate Z. In the process stage of FIG. 8, plating is possible to form interfacial connections which can have straight or sloping walls relative to the surface of the intermediate.

The first etching process for etching insulating material 2 is preferably a plasma etching process. This first etching process can alternatively be a chemical etching process. Plasma etching and chemical etching produce identical under-etching effects. Chemically etchable insulator materials 2 can be organic, dielectric films of various kinds including, for example, those selected from the group including polyimide, epoxy and acrylate films, fiber-reinforced laminates of epoxy, or polyimide resin films which can be etched chemically using mediums such as KMnO$_4$, NaOH, KOH+alcohol, H$_2$SO$_4$, or H$_3$PO$_4$. Such etching processes are proven, known procedures in the circuit board industry. With knowledge of the present invention, it would be an easy matter for one skilled in this art to select the chemical etching parameters for specific insulating and conductive materials used.

The structuring process for structuring the conductive material 1, 3 is a chemical etching process or an electrodeplating process (galvanic deplating). Chemical etching and electrodeplating of conductive material 1, 3 produce the same effect of removing projecting edges around openings in insulator material 2 by removing material 1, 3. The conductive material consists of electrically conductive layers such as layers of metals such as copper aluminum or silver. Such electrodeplating processes are known, proven procedures in the circuit board industry. The removal rate is uniform and can be very precisely controlled. It is easy for the expert with the knowledge of the present invention to electrodeplate, for example, thin copper layers 1, 3 and to entirely remove projecting edges around openings in insulator material 2 by partially removing copper layers 1, 3.

The structuring process stage for structuring insulator material 2 can be a plasma etching process or a chemical etching process. Thus, four different realizations of the inventive process are possible, as follows.

According to a first form of the invention, the first structuring process stage uses plasma etching of openings 8, 8' in insulating material 2 in accordance with the locations of prepared openings 7, 7' in the conductive material, leaving projecting edges 9, 9' of prepared openings 7, 7' as a result of back etching. In a second structuring process stage, conductive material is chemically etched and the projecting edges are removed with the result that the prepared openings 7, 7' and openings 8, 8' are structured in a planned etch-back-free manner.

In a second form of the invention, the first structuring process stage uses plasma etching of openings 8, 8' in insulating material 2 as determined by the locations of openings 7, 7' in the conductive material 1, 3. Projecting edges around the opening remain as the result of back etching. In a second stage, the conductive material is electrodeplated and the projecting edges are removed, also with the result that the openings 7, 7' and 8, 8' are formed in a planned manner, eliminating the back-etching.

In a third form of the invention, the first structuring process stage uses chemical etching of openings 8, 8' in the insulating material, as determined by the locations of prepared openings 7, 7' in the conductive material, leaving projecting edges 9, 9' from back etching. In a second process stage, the conductive material is chemically etched, removing the projecting edges.

In the fourth realization of the invention, the first process stage uses chemical etching of openings 8, 8', again leaving the projecting edges. In a second process stage, the conductive material is electrodeplated, eliminating the projecting edges.

What is claimed is:

1. A process for producing printed circuit boards and film circuit boards comprising the steps of
   providing a starting product (A) having a layer of insulating material coated on opposite sides with layers of electrically conductive material,
   forming openings at selected locations through one layer of electrically conductive material,
   plasma etching openings in the insulating material at locations of selected ones of the openings through the one layer of conductive material in such a way that back-etching produces projecting edges of conductive material around the openings in the insulating material, and that the openings in the insulating material have walls which slope inwardly away from the layer of conductive material,
   removing the projecting edges by uniformly chemically etching the electrically conductive material in all accessible surface areas whereby the projecting edges are etched away and other portions of the conductive material are thinned to produce a laminated body with openings for use in a circuit board or film, and
   plating surfaces of the openings etched into the insulating material, thereby forming interfacial electrical connections between the layers of electrically conductive material.

2. A process according to claim 1 and further including
   plating the openings in the insulating material with a layer of metal and concurrently plating the electrically conductive material with a layer of metal to reinforce the thinned conductive material.

3. A process according to claim 1 including forming circuit patterns in at least one of the layers of electrically conductive material.

4. A process according to claim 1 wherein the step of removing is performed instead of by uniformly chemically etching, by uniformly electrodeplating the electrically conductive material in all accessible surface areas whereby the projecting edges are deplated and other portions of the conductive material are thinned.

5. A process according to claim 1 including forming circuit patterns in at least one of the layers of electrically conductive material.

6. A process according to claim 1 wherein the insulating material is an organic, dielectric film having a thickness of between 25 and 50 μm and wherein the electrically conductive material is a layer of copper having a thickness-of between 8 and 12 μm.

7. A process according to claim 6 wherein said dielectric film is a polyimide film or a liquid crystal polymer film.

8. A process according to claim 6 wherein said dielectric film is an aramide fiber-reinforced laminate of epoxy or polyimide resin films.

9. A process according to claim 6 wherein said dielectric film is an aramide fiber-reinforced laminate of cyanate-ester resin films.

10. A process according to claim 1 wherein the step of plating includes plating with copper or palladium.

\* \* \* \* \*